US012592693B2

(12) United States Patent
Tang et al.

(10) Patent No.: US 12,592,693 B2
(45) Date of Patent: Mar. 31, 2026

(54) GATE DRIVING CIRCUIT WITH SWITCHED-CAPACITOR CIRCUIT TO GENERATE NEGATIVE GATE-SOURCE VOLTAGE PULSES

(71) Applicant: City University of Hong Kong, Kowloon (HK)

(72) Inventors: Ho Tin Tang, Tsuen Wan (HK); Shu Hung Henry Chung, Mid-Levels (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 104 days.

(21) Appl. No.: 18/818,909

(22) Filed: Aug. 29, 2024

(65) Prior Publication Data

US 2026/0066892 A1 Mar. 5, 2026

(51) Int. Cl.
H03K 17/16 (2006.01)
H02M 1/08 (2006.01)

(52) U.S. Cl.
CPC ............. H03K 17/162 (2013.01); H02M 1/08 (2013.01)

(58) Field of Classification Search
None
See application file for complete search history.

(56) References Cited

U.S. PATENT DOCUMENTS 11,482,919 B2 * 10/2022 Lai .......................... H02M 3/07
12,021,535 B1 * 6/2024 Tang .................... H03K 5/2472
12,446,282 B2 * 10/2025 Kinoshita .............. H02M 1/08

OTHER PUBLICATIONS

J. Wang, H. Chung, and T. Li, "Characterization and experimental assessment of the Effects of Parasitic Elements on the MOSFET Switching Performance," IEEE Transactions on Power Electronics, vol. 28, No. 1, pp. 573-590, Jan. 2013, 18 pages.
J. Wang and H. Chung, "Impact of Parasitic Elements on the Spurious Triggering Pulse in Synchronous Buck Converter," IEEE Transactions on Power Electronics, vol. 29, No. 12, pp. 6672-6685, Dec. 2014, 14 pages.
Y. Li, M. Liang, J. Chen, T. Q. Zheng and H. Guo, "A Low Gate Turn-Off Impedance Driver for Suppressing Crosstalk of SiC MOSFET Based on Different Discrete Packages," in IEEE Journal of Emerging and Selected Topics in Power Electronics, vol. 7, No. 1, pp. 353-365, Mar. 2019, 13 pages.
K. Yamaguchi, K. Katsura, T. Yamada and Y. Sato, "Comprehensive evaluation of gate boost driver for SiC-MOSFETs," 2016 IEEE Energy Conversion Congress and Exposition (ECCE), Milwaukee, WI, 2016, pp. 1-8, 8 pages.

(Continued)

*Primary Examiner* — Cassandra F Cox
(74) *Attorney, Agent, or Firm* — Francis J. Maguire; WARE FRESSOLA MAGUIRE & BARBER LLP

(57) ABSTRACT

An apparatus for driving a MOSFET, which includes a first gate driver adapted to generate a driving signal for a MOSFET, a switched capacitor circuit connected to the first gate driver and adapted to generate temporarily a negative voltage to counteract a spurious voltage occurred at the first gate driver; and a second gate driver comprising adapted to drive the switched capacitor circuit. The first gate driver and the second gate driver are powered by a same voltage source and controlled by a same control logic. The apparatus is adapted to momentarily generate a negative voltage that could counteract the spurious voltage generated by switching devices, and improve the switching performance.

12 Claims, 10 Drawing Sheets

(56)　　　　　References Cited

OTHER PUBLICATIONS

F. Gao, Q. Zhou, P. Wang and C. Zhang, "A Gate Driver of SiC MOSFET for Suppressing the Negative Voltage Spikes in a Bridge Circuit," in IEEE Transactions on Power Electronics, vol. 33, No. 3, pp. 2339-2353, Mar. 2018, 15 pages.

Z. Zhang, J. Dix, F. F. Wang, B. J. Blalock, D. Costinett and L. M. Tolbert, "Intelligent Gate Drive for Fast Switching and Crosstalk Suppression of SiC Devices," in IEEE Transactions on Power Electronics, vol. 32, No. 12, pp. 9319-9332, Dec. 2017, 14 pages.

Z. Zhang, Z. Wang, F. Wang, L. M. Tolbert and B. J. Blalock, "Reliability-oriented design of gate driver for SiC devices in voltage source converter," 2015 IEEE International Workshop on Integrated Power Packaging (IWIPP), Chicago, IL, 2015, pp. 20-23, 4 pages.

Z. Zhang, F. Wang, L. M. Tolbert and B. J. Blalock, "Active Gate Driver for Crosstalk Suppression of SiC Devices in a Phase-Leg Configuration," in IEEE Transactions on Power Electronics, vol. 29, No. 4, pp. 1986-1997, Apr. 2014, 12 pages.

S. Yin, K. J. Tseng, C. F. Tong and R. Simanjorang, "Design of high-speed gate driver to reduce switching loss and mitigate parasitic effects for SiC MOSFET," in IET Power Electronics, vol. 10, No. 10, pp. 1183-1189, 18 8 2017, 7 pages.

S. Zhao et al., "Adaptive Multi-Level Active Gate Drivers for SiC Power Devices," in IEEE Transactions on Power Electronics, vol. 35, No. 2, pp. 1882-1898, Feb. 2020, 17 pages.

Y. Yang, Y. Wen and Y. Gao, "A Novel Active Gate Driver for Improving Switching Performance of High-Power SiC MOSFET Modules," in IEEE Transactions on Power Electronics, vol. 34, No. 8, pp. 7775-7787, Aug. 2019, 13 pages.

Y. Chen, R. Wang, X. Liu and Y. Kang, "Gate-Drive Power Supply With Decayed Negative Voltage to Solve Crosstalk Problem of GaN Synchronous Buck Converter," in IEEE Transactions on Power Electronics, vol. 36, No. 1, pp. 6-11, Jan. 2021, 6 pages.

P. V. Pol, S. L. Patil and S. K. Pandey, "A simple and novel technique for driving silicon carbide power MOSFETs with unipolar supply voltage," 2016 IEEE International Conference on Power Electronics, Drives and Energy Systems (PEDES), Trivandrum, 2016, pp. 1-6, 6 pages.

F. Mo, J. Furuta and K. Kobayashi, "A low surge voltage and fast speed gate driver for SiC MOSFET with switched capacitor circuit," 2016 IEEE 4th Workshop on Wide Bandgap Power Devices and Applications (WiPDA), Fayetteville, AR, 2016, pp. 282-285, 4 pages.

H. Gui, J. Sun and L. M. Tolbert, "Charge Pump Gate Drive to Reduce Turn-On Switching Loss of SiC MOSFETs," in IEEE Transactions on Power Electronics, vol. 35, No. 12, pp. 13136-13147, Dec. 2020, 12 pages.

Q. He, Y. Zhu, H. Zhang, A. Huang, Q. Cai and H. Kim, "A Multilevel Gate Driver of SiC mosfets for Mitigating Coupling Noise in Bridge-Leg Converter," in IEEE Transactions on Electromagnetic Compatibility, vol. 61, No. 6, pp. 1988-1996, Dec. 2019, 9 pages.

C. Li et al., "High Off-State Impedance Gate Driver of SiC MOSFETs for Crosstalk Voltage Elimination Considering Common-Source Inductance," in IEEE Transactions on Power Electronics, vol. 35, No. 3, pp. 2999-3011, Mar. 2020, 13 pages.

A. Maerz, T. Bertelshofer, M. Bakran and M. Helsper, "A Novel Gate Drive Concept to Eliminate Parasitic Turn-on of SiC MOSFET in Low Inductance Power Modules," PCIM Europe 2017; International Exhibition and Conference for Power Electronics, Intelligent Motion, Renewable Energy and Energy Management, Nuremberg, Germany, 2017, pp. 1-7, 7 pages.

J. Henn et al., "Intelligent Gate Drivers for Future Power Converters," in IEEE Transactions on Power Electronics, vol. 37, No. 3, pp. 3484-3503, Mar. 2022.

"Si827x Data Sheet," Datasheet of SI8275, Rev. A, Silicon Labs, Jun. 2022, 47 pages.

* cited by examiner

GATE DRIVING CIRCUIT WITH SWITCHED-CAPACITOR CIRCUIT TO GENERATE NEGATIVE GATE-SOURCE VOLTAGE PULSES

FIELD OF INVENTION

This invention relates to electronic circuits, and in particular to gate driving circuits for transistors.

BACKGROUND OF INVENTION

Bridge-leg configuration, which is formed by two series-connected switching devices, has been widely used in power converters as a gate driver to drive MOSFETs. The two switching devices are alternately switched in normal operations. However, due to the presence of unavoidable delay time, turn-on and turn-off times, the switching devices could be partially turned on simultaneously, leading to a shoot-through. To ensure safe operation, a practical way is to turn off both switching devices at the same time within a short period, known as the deadtime $t_d$, before turning on either one of the switches.

Despite the introduction of $t_d$ can prevent the overlapping of the driving signal deriving from the gate drive integrated circuit (IC), switching on and off the MOSFET will result in high dv/dt on the MOSFET and affect the gate voltage caused by the intrinsic parameters of the MOSFET. When the control switch (i.e., one of the two switching devices) in the bridge-leg configuration is switched on, a positive spurious voltage occurs on the synchronous switch; if this voltage exceeds the MOSFET's threshold voltage, the MOSFET will partially turn on, leading to a large shoot-through current. This can increase the power loss of the converter or even cause device failure. Similarly, when the control switch is switched off, a negative spurious voltage occurs. If this voltage exceeds the MOSFET's maximum allowable gate-source voltage, it can also lead to device failure. Detailed analysis can be found in [1] and [2]. This issue is even worse in wide-bandgap devices, such as silicon carbide (SiC) MOSFETs, because of their high switching speed.

A large body of literature has been devoted to address the spurious voltage issue and maximize the performance of switching devices in the bridge leg. Many solutions have been proposed and can be categorized into two main approaches. The first approach aims to reduce the magnitude of spurious voltage. Since the spurious voltage is mainly caused by the displacement current through the gate resistance, it can be reduced by reducing the impedance of the gate path passively, such as using a small turn-off gate resistor [3]-[4], connecting a capacitor [4]-[5] or a diode [6]-[7] across the gate resistor. Alternatively, an active approach involves inserting a transistor between the gate and source that turns on during the occurrence of spurious voltage [4], [5], [8] and [9]. However, these methods can only reduce, not eliminate, the spurious voltage due to the non-zero impedance of the low impedance path and the internal gate resistance in the MOSFET. The second approach involves introducing a negative gate-source voltage during turn-off to ensure that the gate-source voltage is still below the threshold voltage when the spurious voltage occurs. The methods include using an additional negative voltage source for the gate driver output [6], [7], and [11], passive circuit [5], [12] and [13], active circuit [6], [8], and [14]-[17], or charge pump circuits [14]-[15]. As shown in FIG. 1, a simple way is to add a negative voltage source VGG_L to bias the gate-source voltage to negative during the off state. However, the circuit may require an additional voltage supply to generate a negative voltage. Also, the steady negative voltage may reduce the lifetime of the MOSFET [18]-[19]. In addition, the steady negative gate-source voltage will increase the forward voltage of the body diode and reduce the allowable negative spurious voltage.

Recently, a multi-level gate driver technique has been developed [6], [8], [10]-[12] and [16]. The method is based on providing a negative gate-source voltage only within a short period before the positive spurious voltage occurs to prevent a false turn-on. The gate-source voltage will be back to zero so that the gate oxide's stress can be reduced. Also, the device can accept a higher magnitude of negative pulse voltage than static off-state voltage.

REFERENCES

All referenced literatures throughout this disclosure are incorporated herein by reference in their entirety, which include the following references:
[1] J. Wang, H. Chung, and T. Li, "Characterization and experimental assessment of the Effects of Parasitic Elements on the MOSFET Switching Performance," IEEE Transactions on Power Electronics, vol. 28, no. 1, pp. 573-590, January 2013.
[2] J. Wang and H. Chung, "Impact of Parasitic Elements on the Spurious Triggering Pulse in Synchronous Buck Converter," IEEE Transactions on Power Electronics, vol. 29, no. 12, pp. 6672-6685 December 2014.
[3] Y. Li, M. Liang, J. Chen, T. Q. Zheng and H. Guo, "A Low Gate Turn-OFF Impedance Driver for Suppressing Crosstalk of SiC MOSFET Based on Different Discrete Packages," in IEEE Journal of Emerging and Selected Topics in Power Electronics, vol. 7, no. 1, pp. 353-365, March 2019.
[4] K. Yamaguchi, K. Katsura, T. Yamada and Y. Sato, "Comprehensive evaluation of gate boost driver for SiC-MOSFETs," 2016 IEEE Energy Conversion Congress and Exposition (ECCE), Milwaukee, WI, 2016, pp. 1-8.
[5] F. Gao, Q. Zhou, P. Wang and C. Zhang, "A Gate Driver of SiC MOSFET for Suppressing the Negative Voltage Spikes in a Bridge Circuit," in IEEE Transactions on Power Electronics, vol. 33, no. 3, pp. 2339-2353 March 2018.
[6] Z. Zhang, J. Dix, F. F. Wang, B. J. Blalock, D. Costinett and L. M. Tolbert, "Intelligent Gate Drive for Fast Switching and Crosstalk Suppression of SiC Devices," in IEEE Transactions on Power Electronics, vol. 32, no. 12, pp. 9319-9332 December 2017.
[7] Z. Zhang, Z. Wang, F. Wang, L. M. Tolbert and B. J. Blalock, "Reliability-oriented design of gate driver for SiC devices in voltage source converter," 2015 IEEE International Workshop on Integrated Power Packaging (IWIPP), Chicago, IL, 2015, pp. 20-23.
[8] Z. Zhang, F. Wang, L. M. Tolbert and B. J. Blalock, "Active Gate Driver for Crosstalk Suppression of SiC Devices in a Phase-Leg Configuration," in IEEE Transactions on Power Electronics, vol. 29, no. 4, pp. 1986-1997 April 2014.
[9] S. Yin, K. J. Tseng, C. F. Tong and R. Simanjorang, "Design of high-speed gate driver to reduce switching loss and mitigate parasitic effects for SiC MOSFET," in IET Power Electronics, vol. 10, no. 10, pp. 1183-1189, 18 Aug. 2017.

[10] S. Zhao et al., "Adaptive Multi-Level Active Gate Drivers for SiC Power Devices," in IEEE Transactions on Power Electronics, vol. 35, no. 2, pp. 1882-1898 February 2020.

[11] Y. Yang, Y. Wen and Y. Gao, "A Novel Active Gate Driver for Improving Switching Performance of High-Power SiC MOSFET Modules," in IEEE Transactions on Power Electronics, vol. 34, no. 8, pp. 7775-7787 August 2019.

[12] Y. Chen, R. Wang, X. Liu and Y. Kang, "Gate-Drive Power Supply With Decayed Negative Voltage to Solve Crosstalk Problem of GaN Synchronous Buck Converter," in IEEE Transactions on Power Electronics, vol. 36, no. 1, pp. 6-11, January 2021.

[13] P. V. Pol, S. L. Patil and S. K. Pandey, "A simple and novel technique for driving silicon carbide power MOSFETs with unipolar supply voltage," 2016 IEEE International Conference on Power Electronics, Drives and Energy Systems (PEDES), Trivandrum, 2016, pp. 1-6.

[14] F. Mo, J. Furuta and K. Kobayashi, "A low surge voltage and fast speed gate driver for SiC MOSFET with switched capacitor circuit," 2016 IEEE 4th Workshop on Wide Bandgap Power Devices and Applications (WiPDA), Fayetteville, AR, 2016, pp. 282-285.

[15] H. Gui, J. Sun and L. M. Tolbert, "Charge Pump Gate Drive to Reduce Turn-ON Switching Loss of SiC MOSFETs," in IEEE Transactions on Power Electronics, vol. 35, no. 12, pp. 13136-13147, December 2020.

[16] Q. He, Y. Zhu, H. Zhang, A. Huang, Q. Cai and H. Kim, "A Multilevel Gate Driver of SiC mosfets for Mitigating Coupling Noise in Bridge-Leg Converter," in IEEE Transactions on Electromagnetic Compatibility, vol. 61, no. 6, pp. 1988-1996 December 2019.

[17] C. Li et al., "High Off-State Impedance Gate Driver of SiC MOSFETs for Crosstalk Voltage Elimination Considering Common-Source Inductance," in IEEE Transactions on Power Electronics, vol. 35, no. 3, pp. 2999-311 March 2020.

[18] A. Maerz, T. Bertelshofer, M. Bakran and M. Helsper, "A Novel Gate Drive Concept to Eliminate Parasitic Turn-on of SiC MOSFET in Low Inductance Power Modules," PCIM Europe 2017; International Exhibition and Conference for Power Electronics, Intelligent Motion, Renewable Energy and Energy Management, Nuremberg, Germany, 2017, pp. 1-7.

[19] J. Henn et al., "Intelligent Gate Drivers for Future Power Converters," in IEEE Transactions on Power Electronics, vol. 37, no. 3, pp. 3484-353 March 2022.

[20] "Si827x Data Sheet," Datasheet of SI8275, Rev. A, SILICON LABS, June 2022.

SUMMARY OF INVENTION

In the light of the foregoing background, it is an object of the present invention to focuses on the above-mentioned weakness and propose alternative method and apparatus of driving the gate of a transistor (such as a SiC MOSFET).

The above object is met by the combination of features of the main claim; the sub-claims disclose further advantageous embodiments of the invention.

One skilled in the art will derive from the following description other objects of the invention. Therefore, the foregoing statements of object are not exhaustive and serve merely to illustrate some of the many objects of the present invention.

Accordingly, the present invention in one aspect is an apparatus for driving a MOSFET, which includes a first gate driver adapted to generate a driving signal for a MOSFET, a switched capacitor circuit connected to the first gate driver and adapted to generate temporarily a negative voltage to counteract a spurious voltage occurred at the first gate driver; and a second gate driver comprising adapted to drive the switched capacitor circuit. The first gate driver and the second gate driver are powered by a same voltage source and controlled by a same control logic.

In some embodiments, the apparatus further includes a gate resistor through which the first gate driver is connected to the gate of the MOSFET.

In some embodiments, the first gate driver contains a first transistor and a second transistor having their drain connected together as an output of the first gate driver to the MOSFET. A source of the second transistor is connected to the switched capacitor circuit.

In some embodiments, the second gate driver contains a third transistor and a fourth transistor having their drain connected together and in turn connected to the switched capacitor circuit.

In some embodiments, a gate of each of the first to fourth transistors is connected to the control logic.

In some embodiments, a source of the each of the first and third transistors is connected to the voltage source.

In some embodiments, the first to fourth transistors are implemented by a gate driver IC.

In some embodiments, the switched capacitor circuit contains a RC circuit that comprises a first resistor and a capacitor connected in parallel.

In some embodiments, the RC circuit is connected at one end to an output of the second gate driver, and at another end connected to a second resistor.

In some embodiments, the second gate driver includes a third transistor and a fourth transistor having their drain connected together and in turn connected to the RC circuit. The second resistor has a first end connected to the RC circuit and a second end connected to a source of the fourth transistor.

In some embodiments, the first end of the second resistor is further connected to the first gate driver.

In some embodiments, the first gate driver contains a first transistor and a second transistor having their drain connected together. The first end of the second resistor is connected to a source of the second transistor. A source of the first transistor is connected to the voltage source.

Embodiments of the invention therefore provide apparatus and method for providing a negative pulse voltage source, which is adapted to momentarily generate a negative voltage that could counteract the spurious voltage generated by transistor(s) in the first gate driver, and improve the switching performance. After the spurious voltage is counteracted, the negative pulse voltage returns to zero during off-state of the transistor(s) in the first gate driver. In one example the circuitry can be easily implemented by a typical gate driver IC.

BRIEF DESCRIPTION OF FIGURES

The foregoing and further features of the present invention will be apparent from the following description of preferred embodiments which are provided by way of example only in connection with the accompanying figures, of which.

In the drawings, like numerals indicate like parts throughout the several embodiments described herein.

DETAILED DESCRIPTION OF THE PREFERRED EMBODIMENTS

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

As used herein and in the claims, "couple" or "connect" refers to electrical coupling or connection either directly or indirectly via one or more electrical means unless otherwise stated. When describing a "direct connection", it means two circuit components, nodes, or terminals are connected to each other without any intermediate components therebetween.

Figure 1:
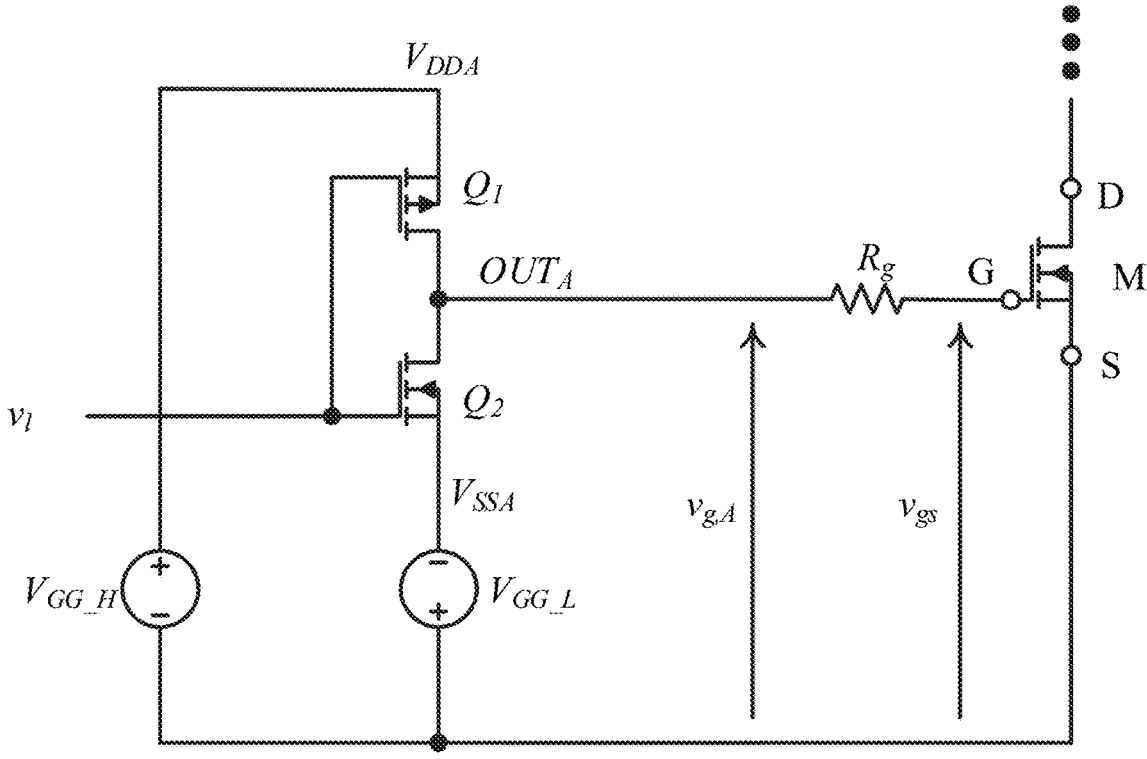
FIG. 1 shows the circuit diagram of a prior art gate driver with a negative bias voltage.
Figure 2:
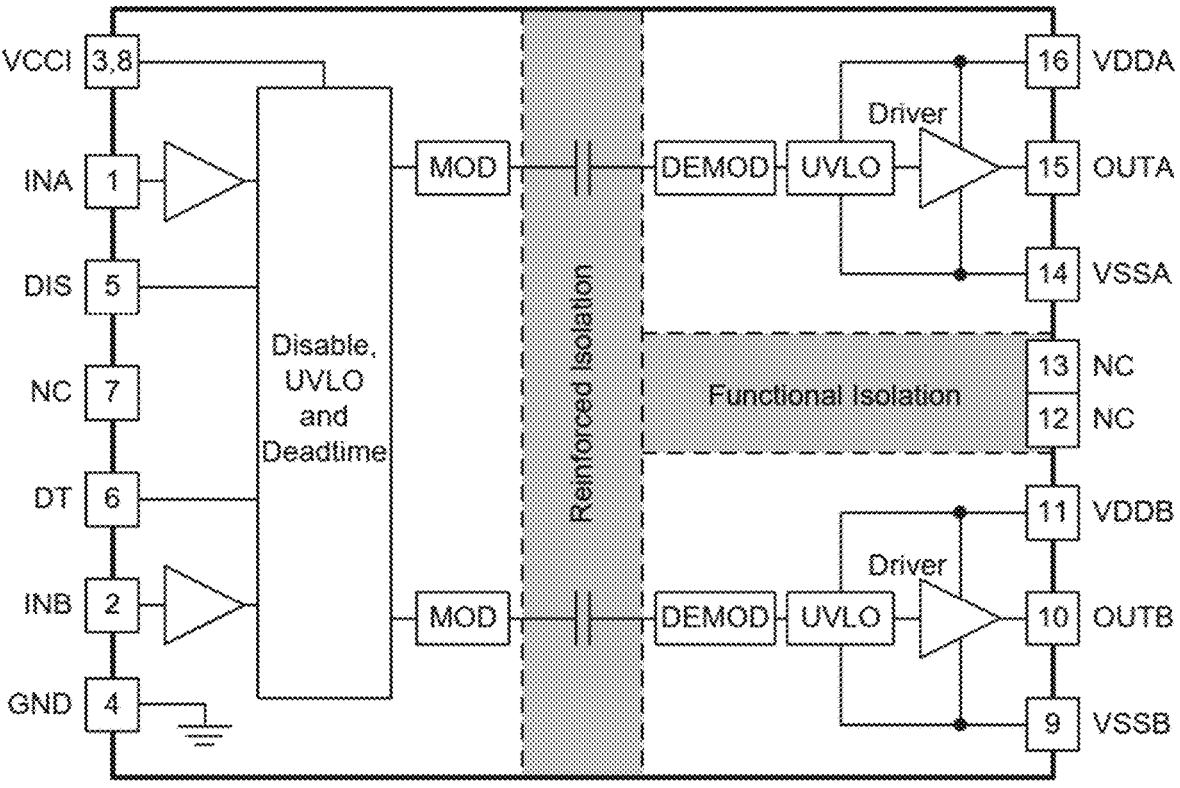
FIG. 2 shows the internal structure of a typical gate driver IC with dual driver.

Embodiments of the invention present switched-capacitor circuits that can provide a negative pulse voltage source. The simple circuitry can be easily implemented by a typical gate driver IC, as shown in FIG. 2. The circuitry can momentarily generate a negative voltage and return to zero during off-state. It can counteract the spurious voltage and improve the switching performance.

Figure 3:
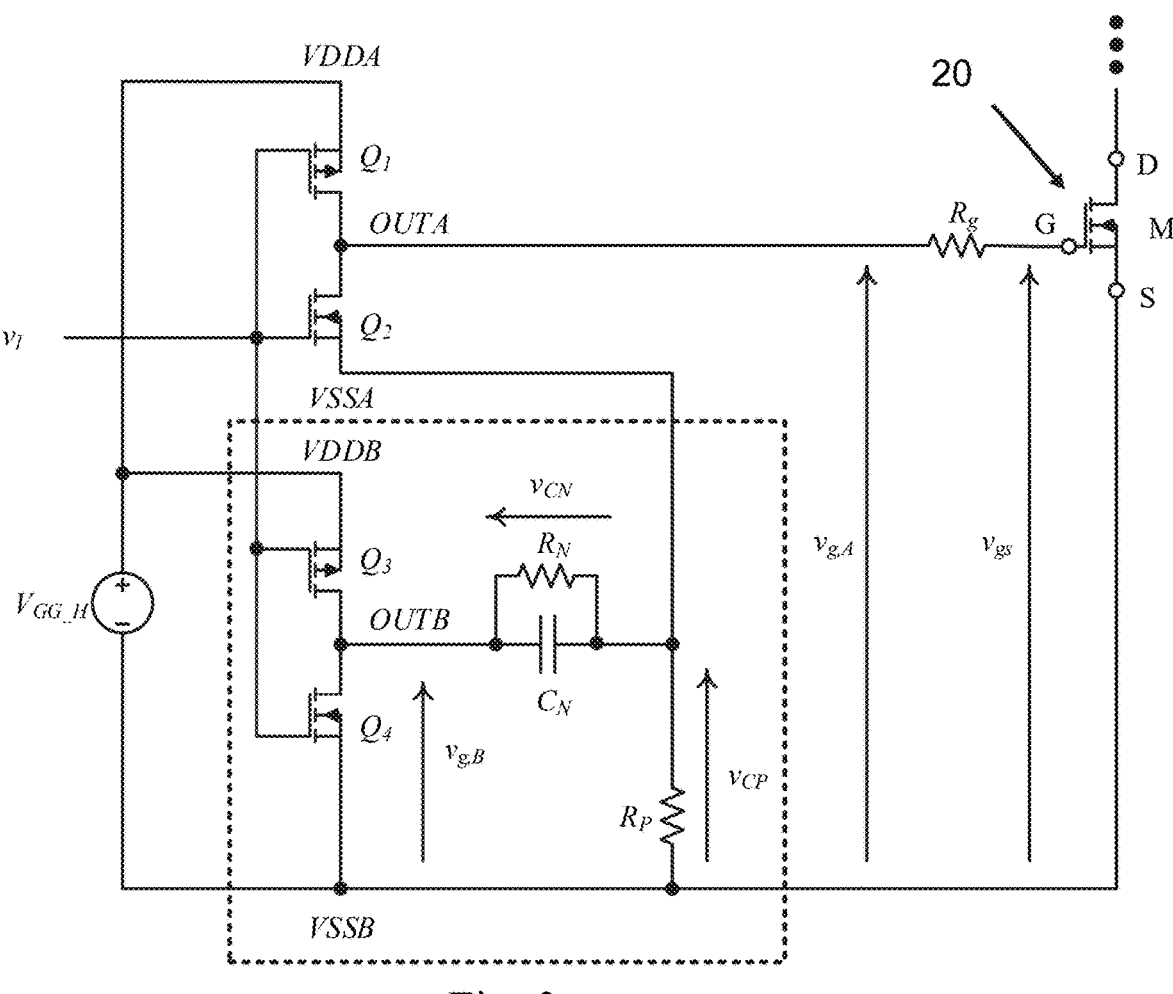
FIG. 3 shows the circuit diagram of a gate driving circuit according to an embodiment of the invention.

FIG. 3 shows a gate-driving circuit according to a first embodiment of the invention, which is an apparatus for driving a MOSFET 20. The MOSFET 20 for example could be a SiC MOSFET. The MOSFET 20 for example may be one of the two series-connected switching devices in a bridge-leg configuration. In the bridge-leg configuration that are extensively found in synchronous buck converters, half/full bridge converters and inverters, there are two complementary switches, one is the control switch which determines the switching speed, the other is the synchronous switch which is in ZVS switching. The MOSFET 20 for example can be the control switch or the synchronous switch in such a bridge-leg configuration.

The gate-driving circuit in FIG. 3 contains four transistors as switching devices, which are $Q_1$, $Q_2$, $Q_3$ and $Q_4$. $Q_1$ and $Q_3$ are P-MOSFETs, while $Q_2$ and $Q_4$ are N-MOSFETs. Transistors $Q_1$ and $Q_2$ form a first gate driver, and transistors $Q_3$ and $Q_4$ form a second gate driver. The gate terminals of all of transistors $Q_1$-$Q_4$ are all connected, and to a control logic $v_1$, which for example is provided by a MCU (micro control unit). The source terminals of transistors $Q_1$ and $Q_3$ are connected and to a positive terminal of a voltage source $V_{GG\_H}$, and the voltage at the source terminal of the transistor Q1 is designated as VDDA. The voltage at the source terminal of the transistor Q3 is designated as VDDB. A voltage at the source terminal of the transistor Q2 is designated as VSSA. A voltage at the source terminal of the transistor $Q_4$ is designated as VSSB.

The drain terminals of transistors $Q_1$ and $Q_2$ are connected and form an output of the first gate driver, as designated by OUTA in FIG. 3. OUTA is connected to a gate terminal of the MOSFET 20 via a gate resistor $R_g$. A voltage at the source terminal of the transistor $Q_2$ is designated as VSSA. The drain terminals of transistors $Q_3$ and $Q_4$ are connected and form an output of the second gate driver, as designated by OUTB in FIG. 3. A voltage at the source terminal of the transistor $Q_4$ is designated as VSSB.

A switched capacitor circuit is connected between the first gate driver and the second gate driver. In particular, the switched capacitor circuit contains a RC circuit that consists of a resistor $R_N$ connected with a capacitor $C_N$ in parallel. The RC circuit has one end connected to OUTB and another end connected to a second resistor $R_P$. The resistor $R_P$ has one end connected to the RC circuit and to the source terminal of the transistor $Q_2$ in the first gate driver. Another end of the resistor $R_P$ is connected to the source terminal of the transistor $Q_4$, the negative terminal of the voltage source $V_{GG\_H}$, and the source terminal of the MOSFET 20.

It should be noted that the first gate driver and the second gate driver can be easily implemented using a gate driver IC with dual drivers, for example the one shown in FIG. 2. The various pins of the IC shown in FIG. 2, including VDDA, VDDB, VSSA, VSSB, OUTA, OUTB may correspond to those defined in FIG. 3.

Having described the components in the circuit of FIG. 3 and their connections, the description now turns to operation of the circuit. The first gate driver consisting of transistors $Q_1$ and $Q_2$ forms a conventional driver circuit. It is driven by the control logic $v_l$ and its output $v_{g,A}$ is the main driver voltage, which is used to control the MOSFET 20 and is switching between $V_{DDA}$ and $V_{SSA}$. On the other hand, the second gate driver consisting of $Q_3$ and $Q_4$ is an auxiliary driver circuit, which shares the same control logic as $Q_1$ and $Q_2$. The output of the second gate driver drives the switched capacitor circuit formed by $R_N$, $R_P$ and $C_N$ to provide a controllable negative voltage source to $V_{SSA}$.

When $v_l$ is changed from logical "HIGH" to logical "LOW", $Q_1$ and $Q_3$ will turn on, and the voltage level of $v_{g,A}$ will change from $V_{SSA}$ to $V_{DDA}$ to turn on the MOSFET 20. The on-state voltage of $v_{g,A}$, $v_{g,A,ON}$, is:

$$v_{g,A,ON} = V_{DDA} \tag{1}$$

At the same time, the voltage level of $v_{g,B}$ will change from $V_{SSB}$ to $V_{DDB}$ which is the same as $V_{DDA}$. Therefore, the on-state voltage of $v_{g,B}$, $v_{g,B,ON}$, is:

$$v_{g,B,ON} = V_{DDA} \tag{2}$$

During the on-state, $C_N$ will be charged up to the voltage determined by $R_N$ and $R_P$. Assuming the time constant of the switched capacitor circuit is much smaller than the period of the switching period of the transistors $Q_1$-$Q_4$, the voltages of $v_{CN}$ and $v_{CP}$ are expressed as $$v_{CN,on}(t) = \frac{R_N\left(1 - e^{\frac{-t}{\tau}}\right)}{(R_N + R_P)} V_{DDA} \tag{3}$$

$$v_{CP,on}(t) = \frac{R_P + R_N e^{\frac{-t}{\tau}}}{(R_N + R_P)} V_{DDA} \tag{4}$$

where $t \in [\,0 \quad dT\,]$, $\tau = C_N \dfrac{R_P R_N}{(R_N + R_P)}$.

At the end of on-state, the capacitor $C_N$ will be fully charged, and the final voltages of $v_{CN}$ and $v_{CP}$ are expressed as, $$V_{CN,ON,f} = \frac{R_N}{R_N + R_P} V_{DDA} \tag{5}$$

$$V_{CP,ON,f} = \frac{R_P}{R_N + R_P} V_{DDA} \tag{6}$$

When $v_I$ is changed from logical "LOW" to logical "HIGH", transistors $Q_2$ and $Q_4$ will turn on, and the voltage level of $v_{g,A}$ will change from $V_{DDA}$ to $V_{SSA}$ which is connected to the midpoint of the switched capacitor network. Thus, $$V_{g,A}(dT^+) = V_{CP}(dT^+) \tag{7}$$

When transistor $Q_4$ is turned on, the charges stored on $C_{gs}$ (not shown) of the MOSFET 20 and that on $C_N$ will be redistributed. The initial voltages of $v_{CN}$ and $V_{CP}$, $v_{CN}$ and $V_{CP}$, respectively, at dT can be expressed as, $$V_{g,A}(dT^+) = V_{CP}(dT^+) = -V_{CN}(dT^+) = -\frac{C_N V_{CN,ON,f} - C_{gs} V_{DDA}}{C_N + C_{gs}} \tag{8}$$

Thus, a negative voltage will be present on $v_{g,A,OFF}$ during a short period. During the off-state, $C_N$ will be discharged and $v_{g,A}$ can be expressed as, $$v_{g,A,OFF}(t) = v_{SSA}(t) = -V_{CN}(dT^+)e^{-\frac{t-dT}{\tau}} \tag{9}$$

where $t \in [dT\ T]$.

If the spurious voltage occurs, the circuit in FIG. 3 (hereinafter "the proposed circuit") can counteract the positive spurious voltage caused by turning on the control switch in the bridge-leg configuration. The deadtime, $t_d$, for the control switch turns on typically within tens of nanoseconds. The maximum allowable spurious voltage, $V_{sp,MAX}$ can be expressed as, $$V_{sp,MAX} = V_{CN}(dT^+)e^{-\frac{t_d}{\tau}} \tag{10}$$

Since the time constant of the switched capacitor network is much smaller than the switching period, at the end of off state, $C_N$ will be fully discharged. The final value of $v_{g,A}$ at the end of off state is, $$V_{g,A,OFF,f} = V_{CP,OFF,f} = V_{CN,OFF,f} = 0 \tag{11}$$

Figure 4:
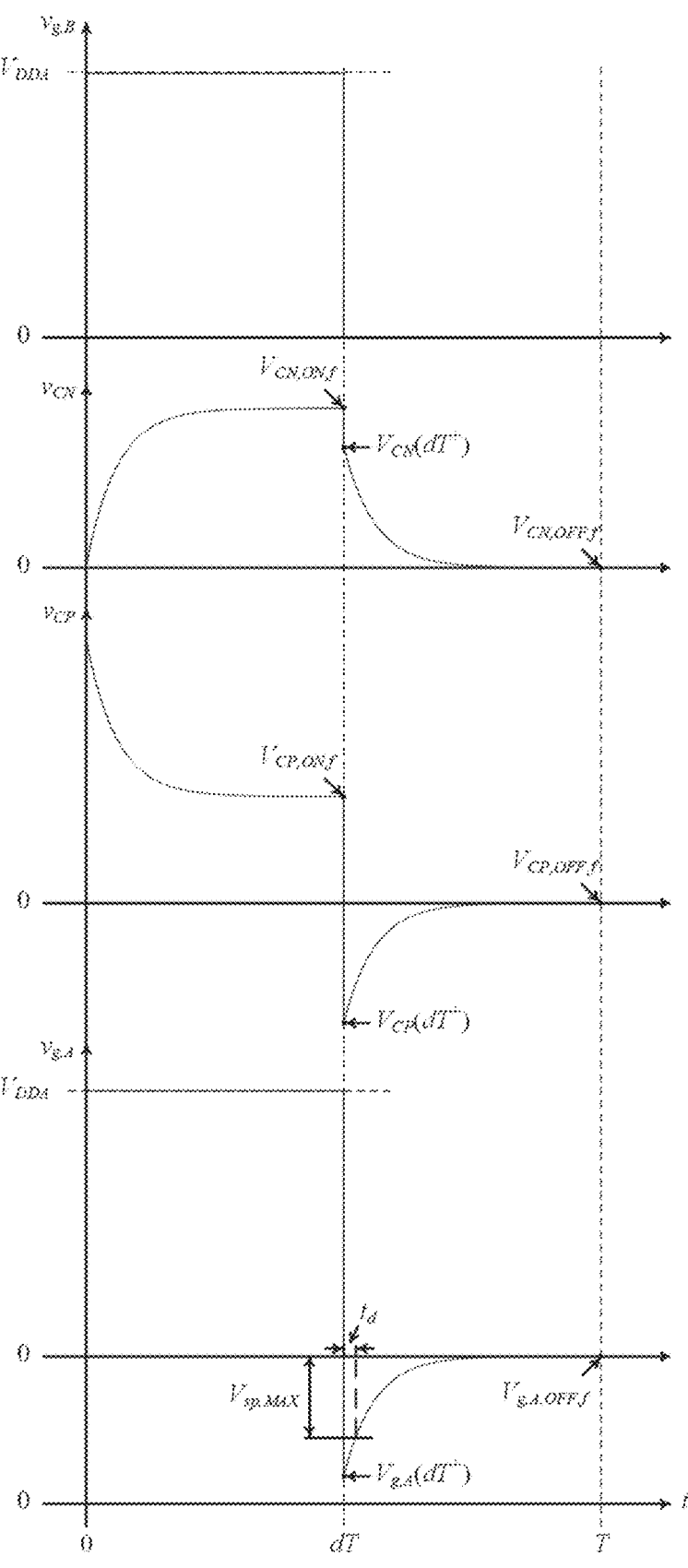
FIG. 4 illustrates the timing diagram of the gate driving circuit of FIG. 3.

The proposed circuit allows a higher negative spurious voltage when the control switch turned off. The timing diagram is shown in FIG. 4.

Figure 5:
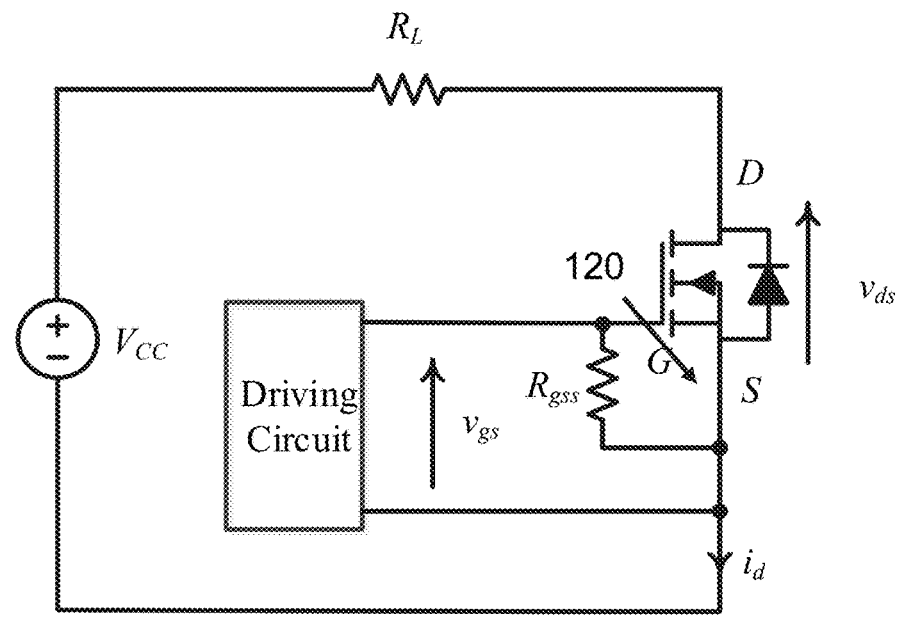
FIG. 5 shows the circuit diagram of a test circuit configured for testing the gate driving circuit of FIG. 3.
Figure 6A:
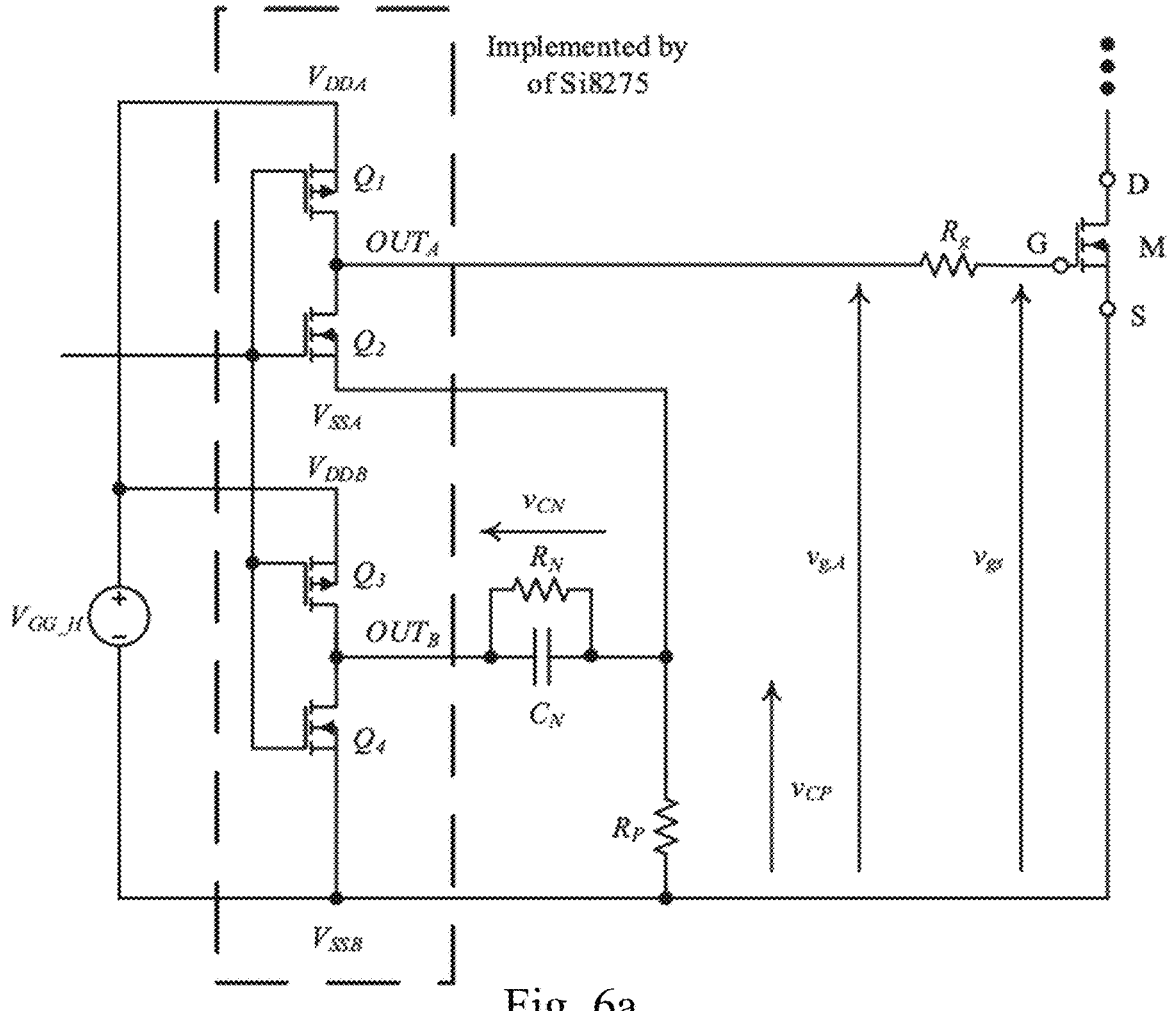
FIG. 6a shows the two transistor pairs of the gate driving circuit in FIG. 5 which are implemented by a gate driving IC.
Figure 6B:
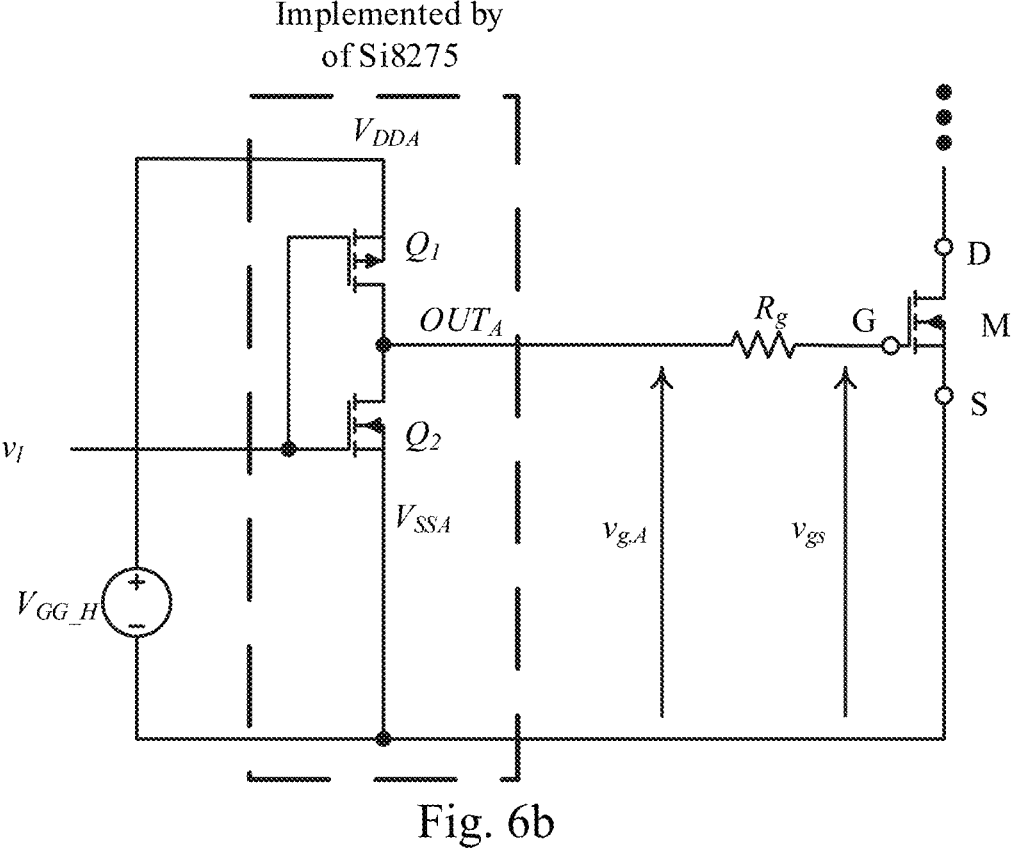
FIG. 6b shows a gate driving circuit with a conventional gate driver as implemented by a gate driving IC, for comparison purposes.
Figure 6C:
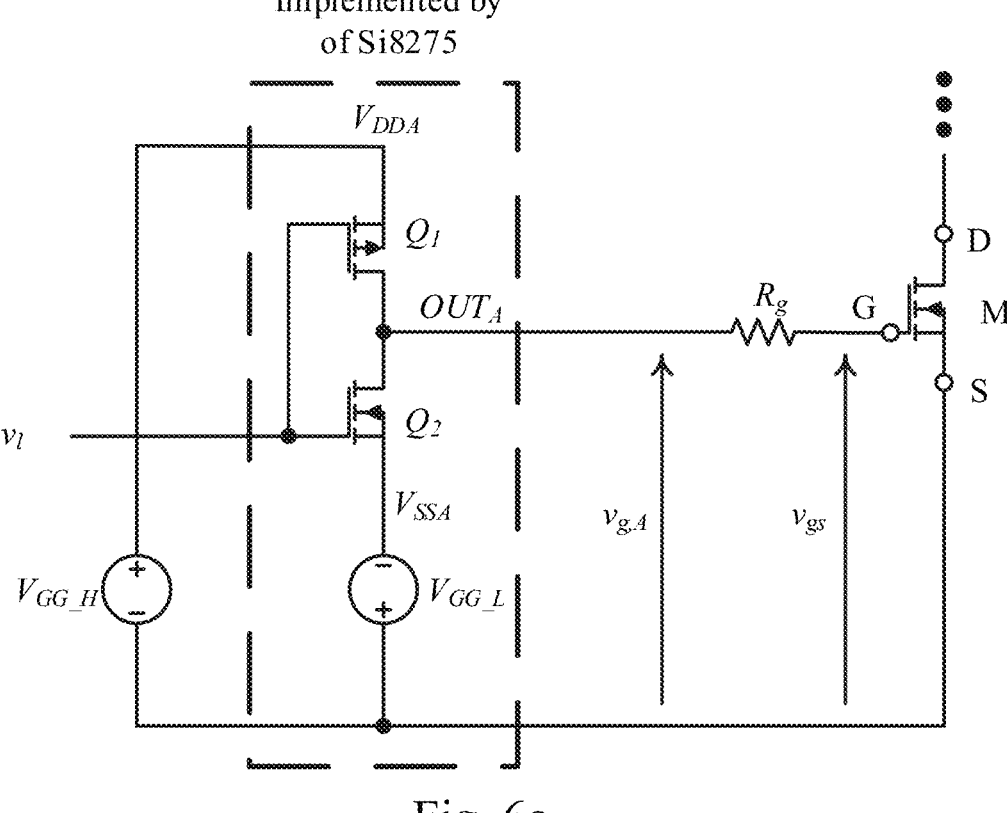
FIG. 6c shows a gate driving circuit with a conventional gate driver as implemented by a gate driving IC, for comparison purposes.

Next, the experimental setup and verification conducted on a prototype of the gate driving circuit designed based on FIG. 3 will be discussed. The circuit used for testing the proposed circuit is shown in FIG. 5. The loading circuit for the test only consists of a SiC MOSFET 120, a loading resistor $R_L$ and the driving circuit which is based on that in FIG. 3. The driving circuit is established by utilizing a typical gate driver IC (Part Number: Si8275) with dual outputs, where $V_{DDB}$ is set to be lower than the $V_{DDA}$ to prevent under-voltage lockout of the IC. To evaluate the performance of the proposed circuit on negative voltage generation and the switching performance, three configurations, as shown in FIGS. 6a-6c respectively, are tested. $Q_1$, $Q_2$, $Q_3$ and $Q_4$ are implemented by using the gate driver IC's internal driving circuit. Configuration 1 is the proposed circuit. Configuration 2 uses the conventional gate driver with $V_{DDA}$=15V and $V_{SSA}$=0V. Configuration 3 uses the conventional gate driver with $V_{DDA}$=15V and $V_{SSA}$=−5V. The part numbers and component values are given in Table I. The waveforms of first gate driver voltage, $v_{g,A}$, gate-source voltage, $v_{gs}$, drain-source voltage, $v_{ds}$ and drain current, $i_d$ are studied.

TABLE I

| Component Part Nos. and Values | | | |
|---|---|---|---|
| Component | Part no./Value | Component | Part no./Value |
| Configuration 1 | | | |
| $V_{DDA}$ | 21 V | $R_N$ | 300Ω |
| $V_{SSA}$ | Connect to $v_{CP}$ | $C_N$ | 10 nF |
| $V_{DDB}$ | 8 V | $R_P$ | 50Ω |
| $V_{SSB}$ | 0 V | $R_g$ | 4.7Ω |
| Configuration 2 | | | |
| $V_{DDA}$ | 21 V | $R_g$ | 4.7Ω |
| $V_{SSA}$ | 0 V | | |
| Configuration 3 | | | |
| $V_{DDA}$ | 21 V | $R_g$ | 4.7Ω |
| $V_{SSA}$ | −5 V | | |

Figure 7A:
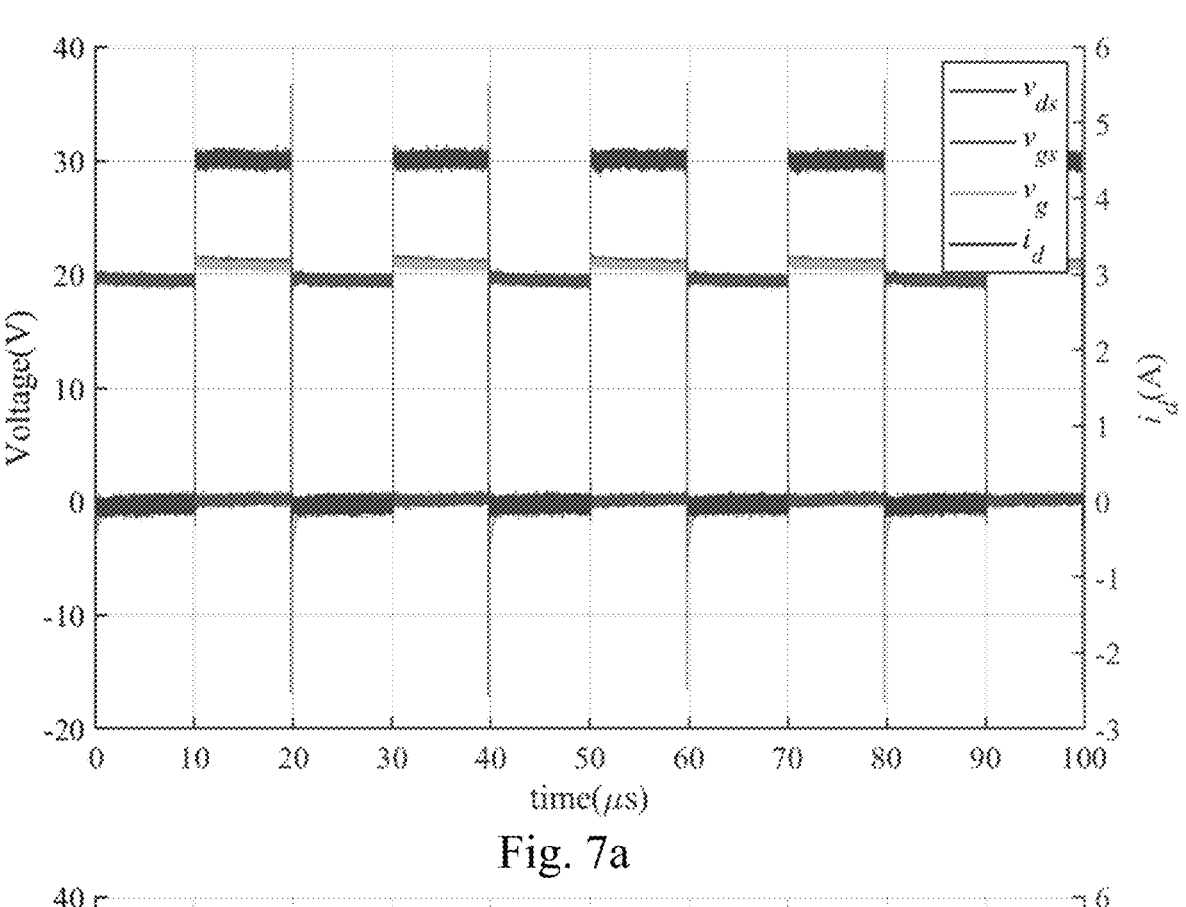
FIG. 7a shows the key waveform of switching cycles in Configuration 1.
Figure 7B:
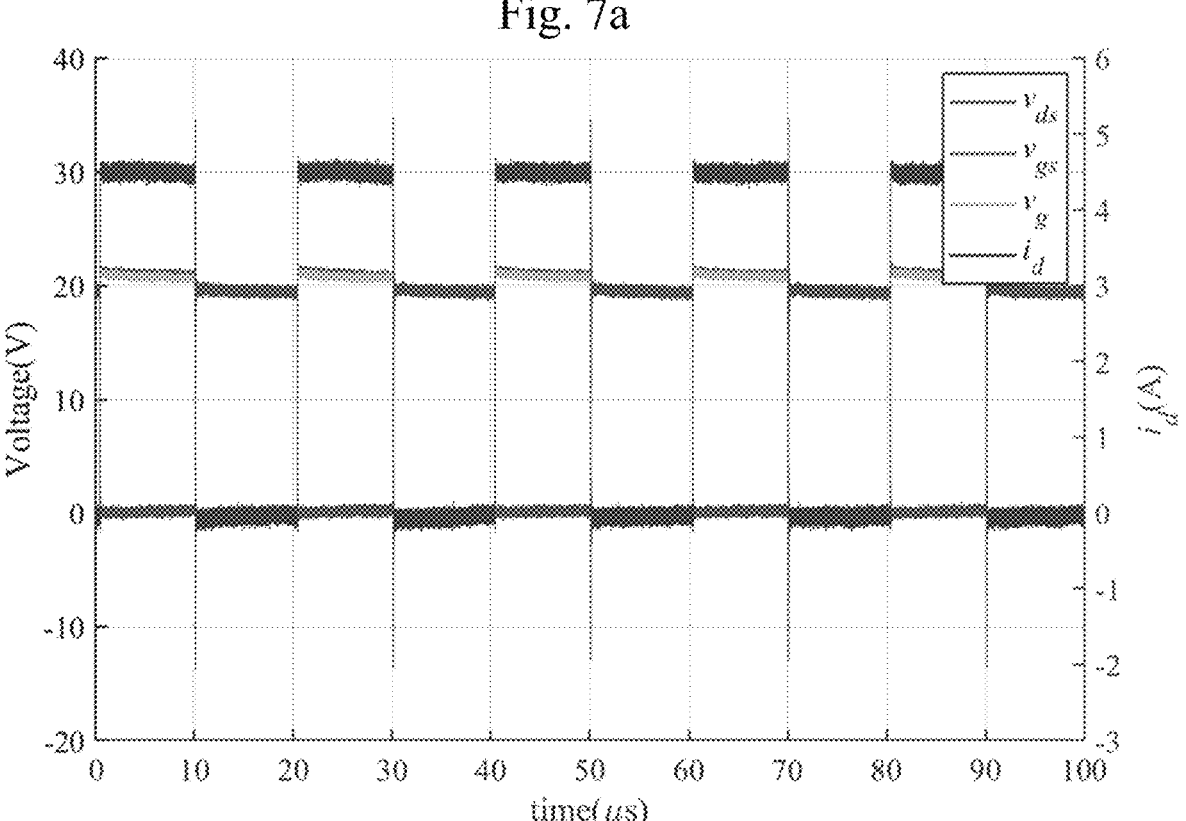
FIG. 7b shows the key waveform of switching cycles in Configuration 2.
Figures 7C, 8A:
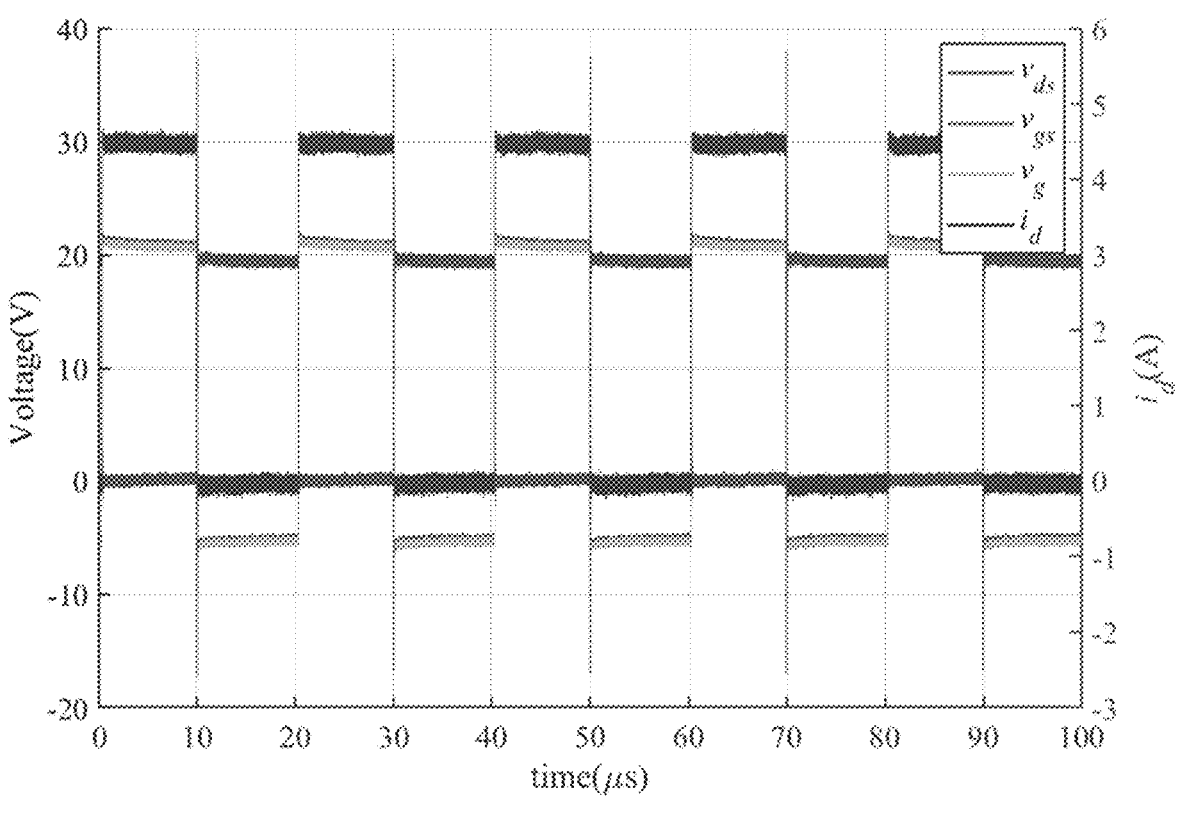
FIG. 7c shows the key waveform of switching cycles in Configuration 3.
FIG. 8a shows magnified waveforms during switching off in Configuration 1.

FIGS. 7a-7c show the waveforms of $v_{g,A}$, $v_{gs}$, $v_{ds}$ and $i_d$ in a few switching cycles of the MOSFET 120. FIGS. 7a, 7b and 7c show the waveforms of Configuration 1, Configuration 2 and Configuration 3, respectively. During on-state, $v_{gs}$ follows $V_{DDA}$ in all configurations. During the off state, $v_{gs}$ has a momentarily short negative voltage and return to 0V in Configuration 1. In Configuration 2, $v_{gs}$ is kept at 0V. In Configuration 3, $v_{gs}$ is kept at −5V.

Figure 8B:
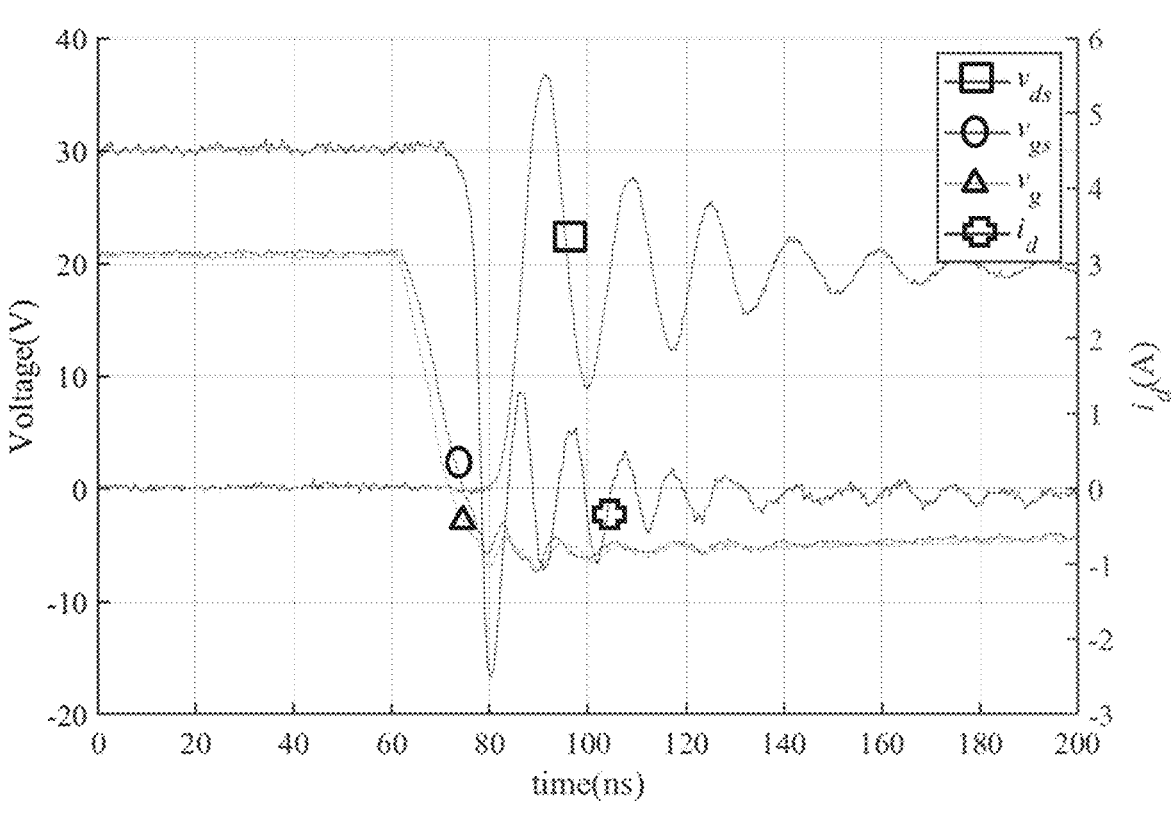
FIG. 8b shows magnified waveforms during switching off in Configuration 2.
Figure 8C:
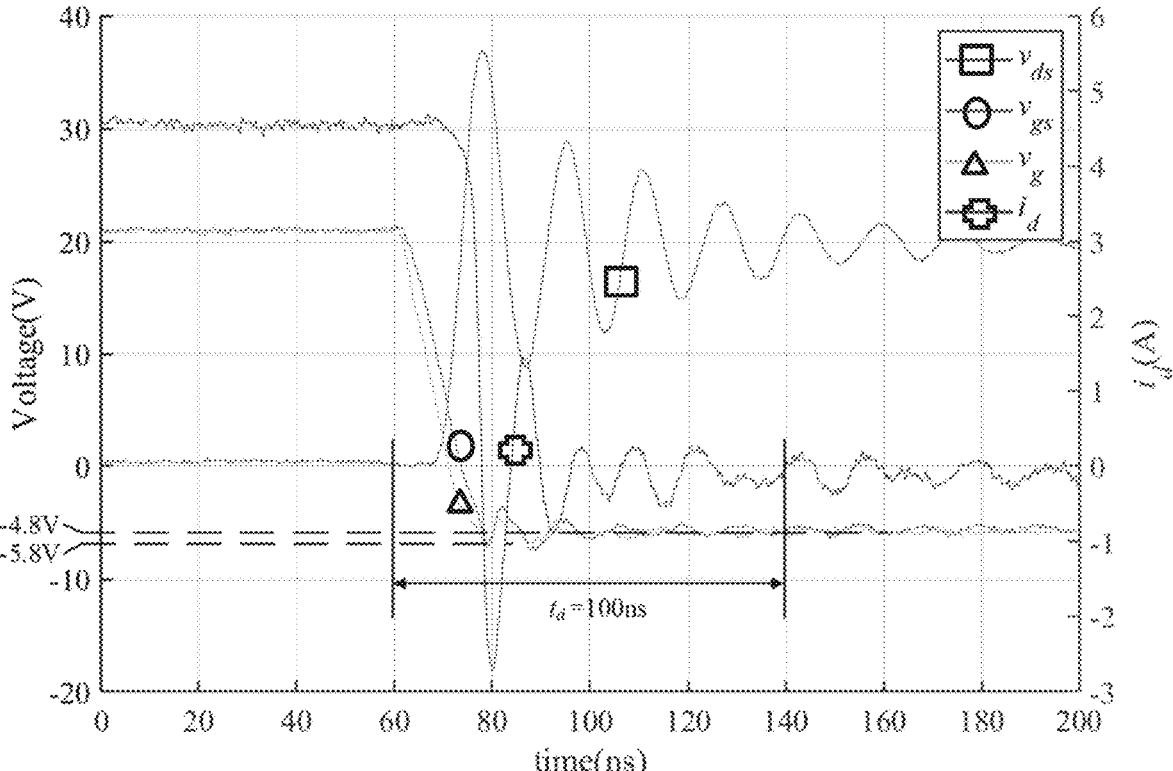
FIG. 8c shows magnified waveforms during switching off in Configuration 3.

FIGS. 8a-8c show the magnified waveforms during switching off of the MOSFET 120 of Configurations 1-3 respectively. The transient and steady state characteristics upon switching off are given in Table II. The nomenclature of the symbols is given as follows:

$V_{ds,ON}$: Steady-state on-state value of $v_{ds}$ $t_{ds,f}$: Fall time of $V_{ds}$ (From 90% to 10% of the steady-state value)

$V_{g,ON}$: Steady-state on-state value of $v_g$ $t_{g,r}$: Rise time of $v_g$ (From 10% to 90% of the steady-state value)

$V_{gs,ON}$: Steady-state on-state value of $v_{gs}$ $t_{gs,r}$: Rise time of $v_{gs}$ (From 10% to 90% of the steady-state value)

$I_{d,ON}$: Steady-state on-state value of $i_d$ $t_{d,r}$: Rise time of $i_d$ (From 10% to 90% of the steady-state value)

TABLE II

Transient and Steady-State Characteristics During Turn Off

| Parameter | Configuration | | |
|---|---|---|---|
| | 1 | 2 | 3 |
| $V_{ds}$ | 20 V | 20 V | 20 V |
| $t_{ds,r}$ | 4.2 ns | 5 ns | 4.2 ns |
| $V_g$ | −5 V | 0 V | −5 V |
| $t_{g,f}$ | 11.6 ns | 8.8 ns | 10.2 ns |
| $V_{gs}$ | −5 V | 0 V | −5 V |
| $t_{gs,f}$ | 13.2 ns | 11.8 ns | 12 ns |
| $I_{d,OFF}$ | 0 A | 0 A | 0 A |
| $t_{d,f}$ | 3.4 ns | 4.4 ns | 3.2 ns |

With the proposed circuit, $v_{CN}$ is temporarily negative upon switching off. $v_{SSA}$ is also negative. Thus, when the MOSFET 120 is switched off, $v_{gs}$ drops from 15V to −5V. Though the falling time of $v_{gs}$ in Configurations 1 and 3 is longer, it passes the threshold voltage much easier. The switching speed with the proposed circuit is higher than Configuration 2 and is similar to Configuration 3.

By observing the turn off waveforms using the proposed circuit shown in FIG. 8a, the peak negative voltage just after the switch is turn off is −5.8V and the voltage level of $v_{gs}$ after 100 ns of switching off, is −4.8V. A spurious voltage with a maximum value equal to 4.8V is allowed. It is nearly the same as the maximum allowable positive spurious voltage when using Configuration 3.

Figure 9A:
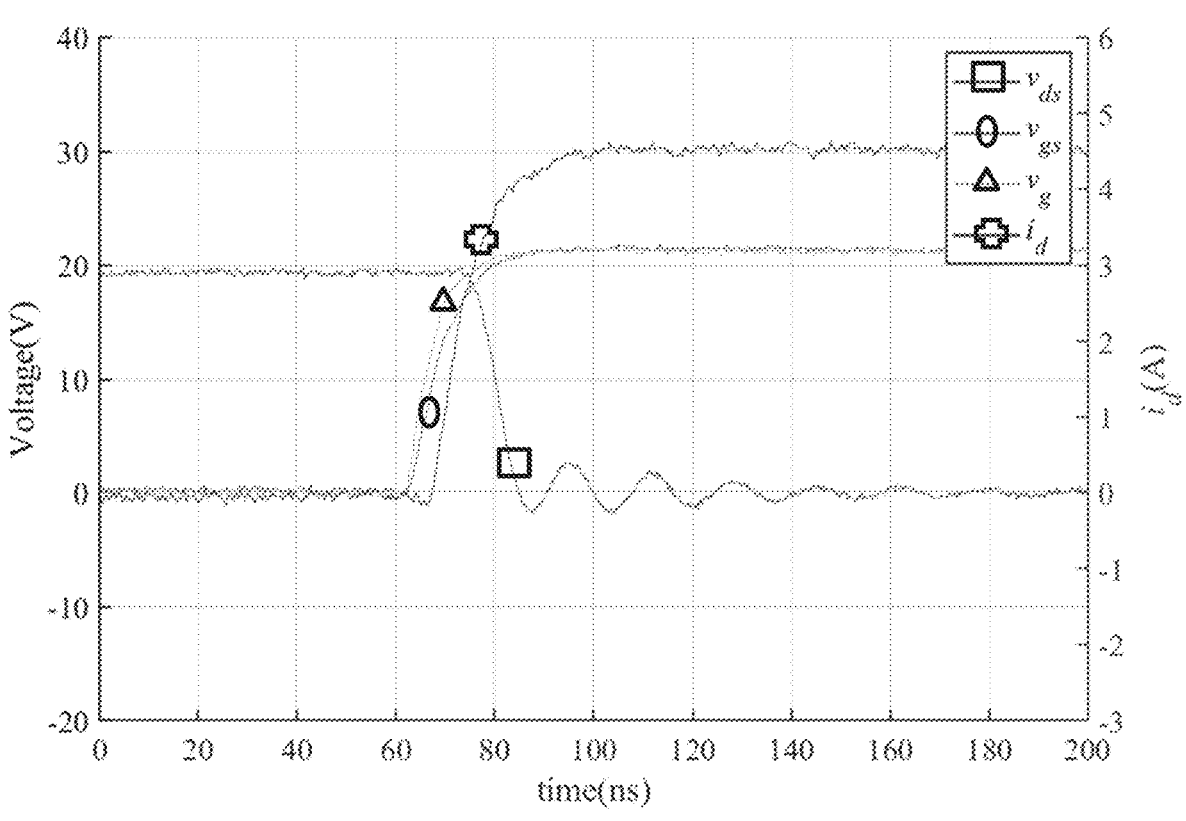
FIG. 9a shows magnified waveforms during switching on in Configuration 1.
Figure 9B:
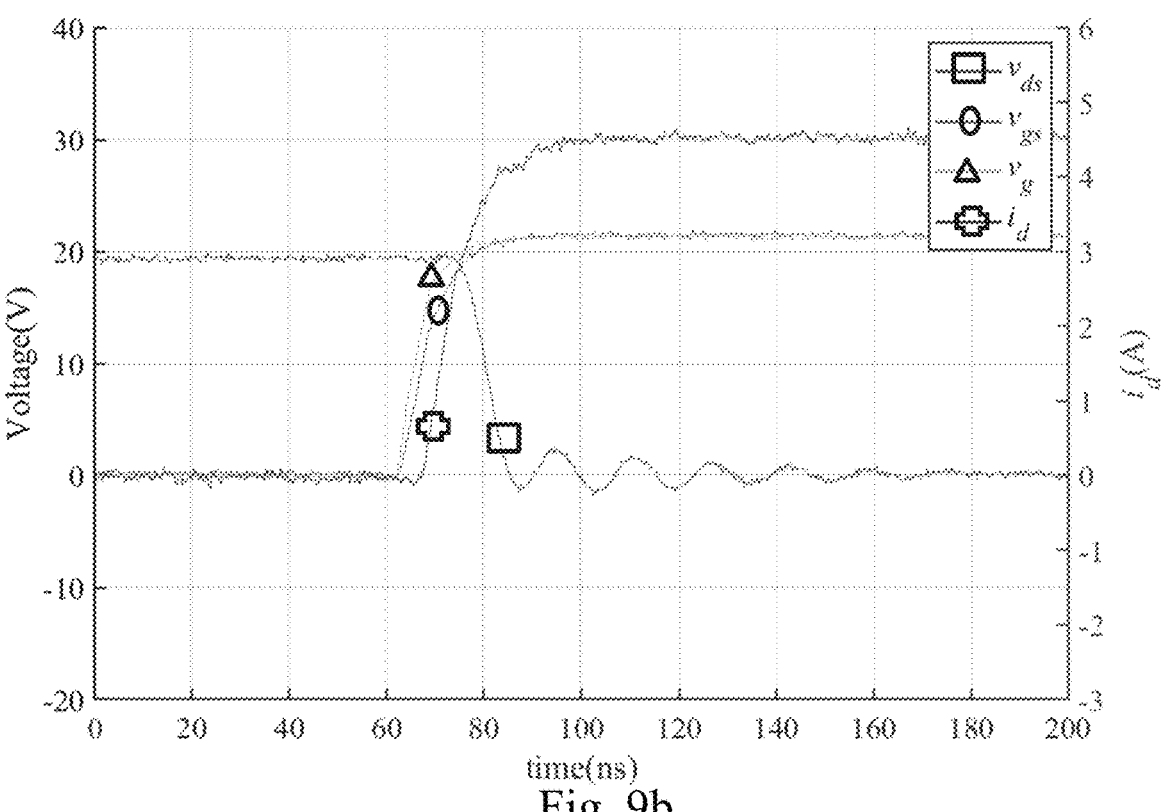
FIG. 9b shows magnified waveforms during switching on in Configuration 2.
Figure 9C:
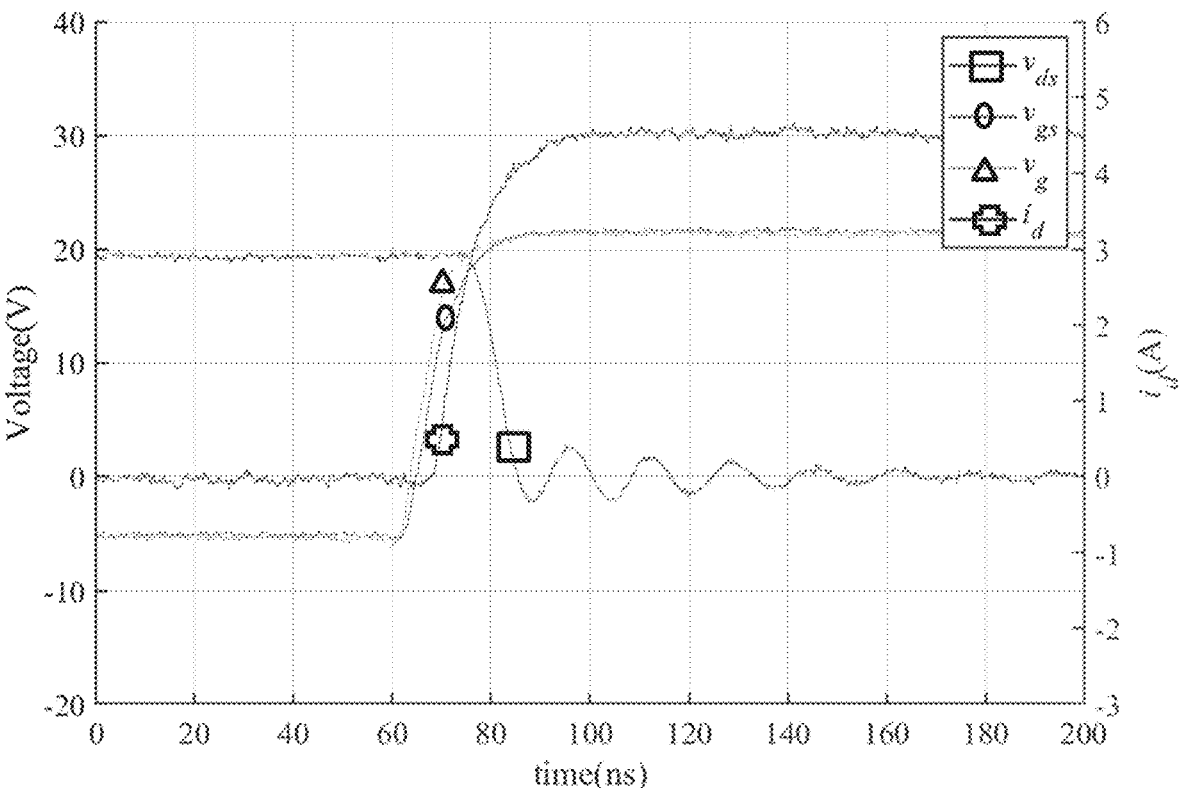
FIG. 9c shows magnified waveforms during switching on in Configuration 3.

FIGS. 9a-9c show the magnified waveforms during switching on of the MOSFET 120 of Configurations 1-3 respectively. The transient and steady state characteristics upon switching on are given in Table III. The nomenclature of the symbols is given as follows:

$V_{ds,ON}$: Steady-state on-state value of $v_{ds}$ $t_{ds,f}$: Fall time of $v_{ds}$ (From 90% to 10% of the steady-state value)

$V_{g,ON}$: Steady-state on-state value of $v_g$ $t_{g,r}$: Rise time of $v_g$ (From 10% to 90% of the steady-state value)

$V_{gs,ON}$: Steady-state on-state value of $v_{gs}$ $t_{gs,r}$: Rise time of $v_{gs}$ (From 10% to 90% of the steady-state value)

$I_{d,ON}$: Steady-state on-state value of $i_d$ $t_{d,r}$: Rise time of $i_d$ (From 10% to 90% of the steady-state value)

TABLE III

Transient and Steady-State Characteristics During Turn On

| Parameter | Configuration | | |
|---|---|---|---|
| | I | II | III |
| $V_{ds,ON}$ | 0.3 V | 0.3 V | 0.3 V |
| $t_{ds,f}$ | 8 ns | 7.8 ns | 7.2 ns |
| $V_{g,ON}$ | 21 V | 21 V | 21 V |
| $t_{g,r}$ | 10.4 ns | 10 ns | 10.2 ns |
| $V_{gs,ON}$ | 21 V | 21 V | 21 V |
| $t_{gs,r}$ | 12.2 ns | 12.6 ns | 13.6 ns |
| $I_{d,ON}$ | 4.7 A | 4.7 A | 4.7 A |
| $t_{d,r}$ | 16 ns | 15.4 ns | 14.6 ns |

As shown in FIG. 9a, when the proposed circuit is used, at the end of the off state, $C_N$ is fully discharged, and the voltage level of $v_{SSA}$ is 0. The maximum allowable negative spurious voltage is close to Configuration 2. Moreover, when the MOSFET is switched on, $v_{gs}$ increases from 0 to 15V, the switching speed is higher than that of Configuration 3 and is similar to Configuration 2.

To conclude, the proposed circuit can provide a pulse negative voltage source to counteract the positive spurious voltage and be discharged to 0V to counteract the negative spurious voltage. Also, it can achieve high turn-on speed like the conventional gate driver with $V_{ssA}$=0V and high switching off speed like the conventional gate driver with $V_{ssA}$=−5V simultaneously. Such that the total switching loss during turn on and turn off is lower than that of using a conventional gate driver with $V_{ssA}$=0V or $V_{ssA}$=−5V. Also, the circuit is easy to implement in typical gate driver IC, the control signal of the additional transistors is the same as the conventional gate driver.

One can see that the proposed circuit in FIG. 3 can provide a pulse negative voltage source to counteract the positive spurious voltage and be discharged to 0V to counteract the negative spurious voltage. Also, it can achieve high turn-on speed like the conventional gate driver with $V_{ssA}$=0V and high switching off speed like the conventional gate driver with $V_{ssA}$=−5V simultaneously. Such that the total switching loss during turn on and turn off is lower than that of using a conventional gate driver with $V_{ssA}$=0V or $V_{ssA}$=−5V. Also, the circuit is easy to implement in typical gate driver IC, the control signal of the additional transistors is the same as the conventional gate driver.

The proposed circuit in FIG. 3 is a gate driving circuit composed of a switched capacitor to provide a negative pulse voltage source has been present. The proposed circuit can generate a negative voltage by a positive voltage source to counteract the spurious voltage and improve the switching performance. Compared with the conventional gate driver, the proposed circuit only requires two transistors, two resistors, and one capacitor. It can easily be implemented by the typical gate driver IC with dual outputs. The proposed circuit has been tested on a 100 W switching circuit. The experimental results show that the proposed circuit can generate the pulse negative voltage through a positive voltage source. The positive spurious voltage can then be counteracted. In addition, the switching performance is improved compared to conventional gate drivers.

The exemplary embodiments of the present invention are thus fully described. Although the description referred to particular embodiments, it will be clear to one skilled in the art that the present invention may be practiced with variation of these specific details. Hence this invention should not be construed as limited to the embodiments set forth herein.

While the invention has been illustrated and described in detail in the drawings and foregoing description, the same is to be considered as illustrative and not restrictive in character, it being understood that only exemplary embodiments have been shown and described and do not limit the scope of the invention in any manner. It can be appreciated that any of the features described herein may be used with any embodiment. The illustrative embodiments are not exclusive of each other or of other embodiments not recited herein. Accordingly, the invention also provides embodiments that comprise combinations of one or more of the illustrative embodiments described above. Modifications and variations of the invention as herein set forth can be made without departing from the spirit and scope thereof, and, therefore, only such limitations should be imposed as are indicated by the appended claims.

What is claimed is:

1. An apparatus for driving a MOSFET, comprising:
   a) a first gate driver adapted to generate a driving signal for a MOSFET;
   b) a switched capacitor circuit connected to the first gate driver and adapted to generate temporarily a negative voltage to counteract a spurious voltage occurred at the first gate driver; and
   c) a second gate driver adapted to drive the switched capacitor circuit;
      wherein the first gate driver and the second gate driver are powered by a same voltage source and controlled by a same control logic.

2. The apparatus of claim 1, further comprises a gate resistor through which the first gate driver is connected to the gate of the MOSFET.

3. The apparatus of claim 1, wherein the first gate driver comprises a first transistor and a second transistor having their drain connected together as an output of the first gate driver to the MOSFET; a source of the second transistor connected to the switched capacitor circuit.

4. The apparatus of claim 3, wherein the second gate driver comprises a third transistor and a fourth transistor having their drain connected together and in turn connected to the switched capacitor circuit.

5. The apparatus of claim 4, wherein a gate of each of the first to fourth transistors is connected to the control logic.

6. The apparatus of claim 4, wherein a source of the each of the first and third transistors is connected to the voltage source.

7. The apparatus of claim 4, wherein the first to fourth transistors are implemented by a gate driver IC.

8. The apparatus of claim 1, wherein the switched capacitor circuit comprises a RC circuit that comprises a first resistor and a capacitor connected in parallel.

9. The apparatus of claim 8, wherein the RC circuit is connected at one end to an output of the second gate driver, and at another end connected to a second resistor.

10. The apparatus of claim 9, wherein the second gate driver comprises a third transistor and a fourth transistor having their drain connected together and in turn connected to the RC circuit; the second resistor having a first end connected to the RC circuit and a second end connected to a source of the fourth transistor.

11. The apparatus of claim 10, wherein the first end of the second resistor is further connected to the first gate driver.

12. The apparatus of claim 11, wherein the first gate driver comprises a first transistor and a second transistor having their drain connected together; the first end of the second resistor connected to a source of the second transistor; a source of the first transistor connected to the voltage source.

* * * * *